United States Patent
Min et al.

(10) Patent No.: US 11,056,197 B2
(45) Date of Patent: *Jul. 6, 2021

(54) CHARGE PUMP AND MEMORY DEVICE INCLUDING THE SAME

(71) Applicant: Samsung Electronics Co., Ltd., Suwon-si (KR)

(72) Inventors: Young-sun Min, Hwaseong-si (KR); Vivek Venkata Kalluru, Suwon-si (KR); Tae-hong Kwon, Seoul (KR); Ki-won Kim, Seongnam-si (KR); Sung-whan Seo, Hwaseong-si (KR); Bilal Ahmad Janjua, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/947,413

(22) Filed: Jul. 31, 2020

(65) Prior Publication Data
US 2020/0365215 A1 Nov. 19, 2020

Related U.S. Application Data

(63) Continuation-in-part of application No. 16/675,914, filed on Nov. 6, 2019, now Pat. No. 10,902,926.

(30) Foreign Application Priority Data

Nov. 8, 2018 (KR) .......................... 10-2018-0136809

(51) Int. Cl.
*G11C 16/04* (2006.01)
*G11C 16/30* (2006.01)
*H02M 3/07* (2006.01)
*G11C 16/10* (2006.01)
*G11C 16/26* (2006.01)

(52) U.S. Cl.
CPC ............... *G11C 16/30* (2013.01); *H02M 3/07* (2013.01); *G11C 16/0483* (2013.01); *G11C 16/10* (2013.01); *G11C 16/26* (2013.01)

(58) Field of Classification Search
CPC ..... G11C 16/30; G11C 16/0483; G11C 16/10; G11C 16/26; H02M 3/07
USPC .................................................. 365/185.18
See application file for complete search history.

(56) References Cited

U.S. PATENT DOCUMENTS 6,831,499 B2   12/2004  Oddone et al.
6,952,129 B2   10/2005  Lin et al.
7,180,362 B2    2/2007  Senda et al.
(Continued)

*Primary Examiner* — Huan Hoang
(74) *Attorney, Agent, or Firm* — Myers Bigel, P.A

(57) ABSTRACT

A charge pump includes: a charging unit including a first n-type transistor connected between an input terminal configured to receive an input voltage and a first node, a second n-type transistor connected between the input terminal and a second node, a first gate control element configured to control the first n-type transistor based on a first clock signal and a second gate control element configured to control the second n-type transistor based on a second clock signal having a phase opposite to the first clock signal; a first pumping capacitor including one end connected to the first node and an other end configured to receive the first clock signal; a second pumping capacitor including one end connected to the second node and an other end configured to receive the second clock signal; and an output unit.

20 Claims, 16 Drawing Sheets

(56) References Cited

U.S. PATENT DOCUMENTS

| | | |
|---|---|---|
| 7,215,179 B2 | 5/2007 | Yamazoe et al. |
| 7,342,438 B2 | 3/2008 | Muneer et al. |
| 7,576,593 B2 | 8/2009 | Chang et al. |
| 8,456,225 B1 | 6/2013 | Snowdon |
| 8,710,908 B2 | 4/2014 | Lin et al. |
| 8,736,351 B2 | 5/2014 | Yang et al. |
| 9,369,115 B2 | 6/2016 | Kalluru et al. |
| 10,665,607 B1 * | 5/2020 | Sugiura .............. H01L 27/10844 |
| 10,714,497 B1 * | 7/2020 | Nishida ............... H01L 27/1157 |
| 2015/0288353 A1 | 10/2015 | Kalluru et al. |
| 2017/0346393 A1 | 11/2017 | Chang et al. |

\* cited by examiner

CHARGE PUMP AND MEMORY DEVICE INCLUDING THE SAME

CROSS-REFERENCE TO RELATED APPLICATION

This application is a continuation-in-part of U.S. patent application Ser. No. 16/675,914, filed Nov. 6, 2019, which claims priority to Korean Patent Application No. 10-2018-0136809, filed on Nov. 8, 2018, in the Korean Intellectual Property Office, the disclosure of which is incorporated herein in its entirety by reference.

BACKGROUND

The inventive concept relates to a charge pump, and, more particularly, to a charge pump and a memory device including the charge pump.

A charge pump has a type of a direct current (DC)-DC converter that generates a voltage that is either higher than an input voltage or lower than a ground voltage. The charge pump may use capacitors as energy storage elements and may include a plurality of switches driven by a clock signal.

A charge pump may be used in circuits in various applications and functions, such as a memory device. For example, a charge pump may generate a voltage higher than a supply voltage in a positive charge pump mode or a voltage lower than the ground voltage in a negative charge pump mode to generate a write voltage or a read voltage of a memory device.

SUMMARY

Embodiments of the inventive concept provide a charge pump including a charging unit, which includes n-type transistors.

According to an aspect of the inventive concept, there is provided a charge pump including: a charging unit including a first n-type transistor connected between an input terminal configured to receive an input voltage and a first node, a second n-type transistor connected between the input terminal and a second node, a first gate control element configured to control the first n-type transistor based on a first clock signal and a second gate control element configured to control the second n-type transistor based on a second clock signal having a phase opposite to the first clock signal; a first pumping capacitor including one end connected to the first node and an other end configured to receive the first clock signal; a second pumping capacitor including one end connected to the second node and an other end configured to receive the second clock signal; and an output unit between the charging unit and an output terminal, the output unit configured to output a first voltage at the first node or a second voltage at second node to the output terminal.

According to another aspect of the inventive concept, there is provided a charge pump including: a first pumping capacitor including one end connected to a first node and an other end configured to receive a first clock signal; a second pumping capacitor including one end connected to a second node and an other end configured to receive a second clock signal that is complementary with the first clock signal; a charging unit including a first n-type transistor configured to charge the first pumping capacitor with an input voltage based on the first clock signal, and a second n-type transistor configured to charge the second pumping capacitor with the input voltage based on the second clock signal; and an output unit connected to the charging unit via the first node and the second node, the output unit configured to alternately output node voltages of the first node and the second node to an output terminal in response to the first clock signal and the second clock signal.

According to another aspect of the inventive concept, there is provided a memory device including: a memory cell array including a plurality of memory cells configured to store data; a control logic configured to output a control signal that controls a program operation or programming data in the memory cell array and a read operation of reading data from the memory cell array; and a voltage generator configured to generate operation voltages used for the program operation and the read operation in response to the control signal, wherein the voltage generator includes: a charging unit including a first n-type transistor connected between an input terminal configured to receive an input voltage and a first node, a second n-type transistor connected between the input terminal and a second node, a first gate control element configured to control the first n-type transistor based on a first clock signal, and a second gate control element configured to control the second n-type transistor based on a second clock signal having a phase opposite to the first clock signal; a first pumping capacitor including one end connected to the first node and an other end configured to receive the first clock signal; a second pumping capacitor including one end connected to the second node and an other end configured to receive the second clock signal; and an output unit connected between the charging unit and an output terminal, the output unit configured to output a first voltage at the first node or a second voltage at the second node to the output terminal.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
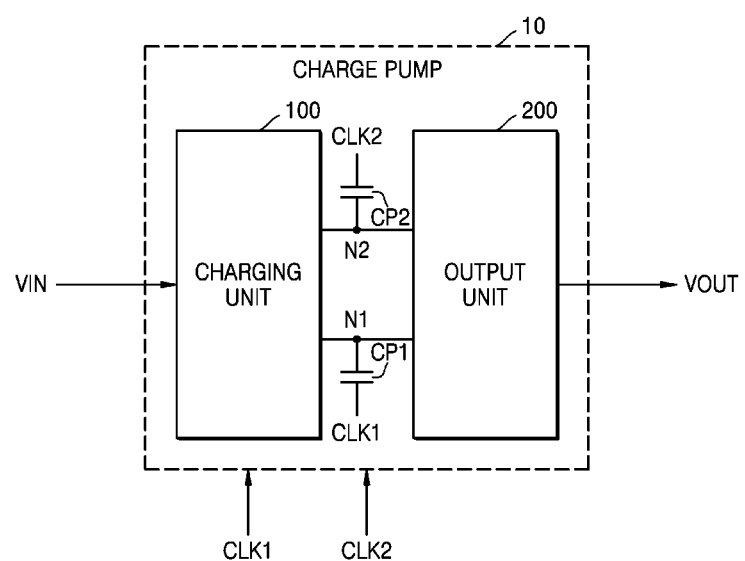
FIG. 1 is a block diagram illustrating a configuration of a charge pump according to some embodiments of the inventive concept.

The inventive concept will now be described more fully with reference to the accompanying drawings, in which example embodiments of the inventive concept are shown. Like reference numerals may refer to like elements throughout this description. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

FIG. 1 is a block diagram illustrating a configuration of a charge pump 10 according to some embodiments of the inventive concept.

Referring to FIG. 1, the charge pump 10 may receive an input voltage VIN, a first clock signal CLK1, and a second clock signal CLK2, and, based thereon, may generate an output voltage VOUT. For example, the charge pump 10 may operate in one of a positive charge pump mode in which the output voltage VOUT is generated by leveling up the input voltage VIN by a risen amount of the first clock signal CLK1 (or the second clock signal CLK2), and a negative charge pump mode in which the output voltage VOUT is generated by leveling down the input voltage VIN by a decrease of the first clock signal CLK1 (or the second clock signal CLK2).

The charge pump 10 may include a charging unit 100, an output unit 200, a first pumping capacitor CP1, and a second pumping capacitor CP2. The charging unit 100 and the output unit 200 may be interconnected via a first node N1 and a second node N2. One end of the first pumping capacitor CP1 may be connected to the first node N1, and the first clock signal CLK1 may be applied to the other end thereof. In addition, one end of the second pumping capacitor CP2 may be connected to the second node N2 and the second clock signal CLK2 may be applied to the other end thereof.

The charging unit 100 may receive the input voltage VIN and may alternately charge the first pumping capacitor CP1 and the second pumping capacitor CP2. In an example embodiment, the charging unit 100 may include a first n-type transistor (or NMOS), which is turned on/turn off based on the first clock signal CLK1 and is arranged between an input terminal configured to receive the input voltage VIN and the first node N1. In addition, the charging unit 100 may include a second n-type transistor which is turned on/turned off based on the second clock signal CLK2 and is arranged between the input terminal and the second node N2. For example, the first clock signal CLK1 and the second clock signal CLK2 may be complementary.

The output unit 200 may be connected to the charging unit 100 via the first and second nodes N1 and N2 and may alternately output node voltages of the first and second nodes N1 and N2 to an output terminal in response to the first clock signal CLK1 and the second clock signal CLK2. In an example embodiment, the output unit 200 may include a third n-type transistor, which is turned on/turned off based on the second clock signal CLK2 and is arranged between the first node N1 and the output terminal. In addition, the output unit 200 may include a fourth n-type transistor which is turned on/turned off based on the first clock signal CLK1 and is arranged between the second node N2 and the output terminal.

For example, when the charge pump 10 operates in the negative charge pump mode, as the first clock signal CLK1 is activated, the input voltage VIN may be applied, and as the first clock signal CLK1 is deactivated, a voltage corresponding to a difference between the input voltage VIN and the first clock signal CLK1 may be applied to the first node N1. When the first and second clock signals CLK1 and CLK2 are complementary, the output unit 200 may output to the output terminal the difference between the input voltage VIN and the first clock signal CLK1 that are applied to the first node N1.

According to an example embodiment, a bulk of each of the first and second n-type transistors provided in the charging unit 100 may be formed in a portion of a deep-n well formed on a p-type semiconductor substrate. For example, when the charge pump 10 operates in the negative charge pump mode, a voltage greater than or equal to a voltage applied to the p-type semiconductor substrate may be applied to the deep-n well. Accordingly, the charge pump 10 according to some embodiments may reduce a body effect that occurs in the negative charge pump mode. A detailed description thereof is provided below.

Figure 2:
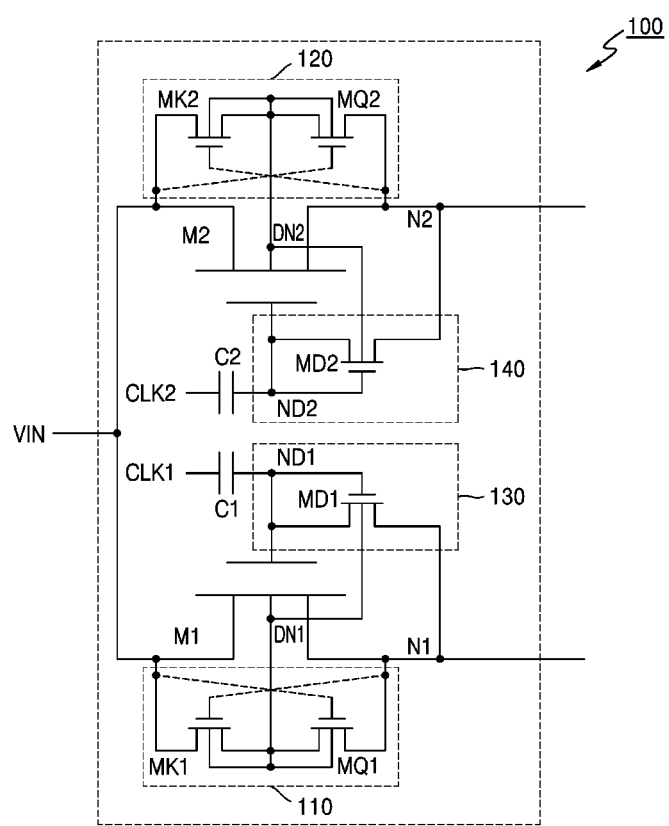
FIG. 2 is a detailed circuit diagram of a charging unit according to some embodiments of the inventive concept.

FIG. 2 is a detailed circuit diagram of a charging unit according to some embodiments of the inventive concept. FIG. 2 may be, for example, a circuit diagram for the charging unit 100 in FIG. 1 according to some embodiments of the inventive concept.

Referring to FIG. 2, the charging unit 100 may include a first n-type transistor M1, a second N-type transistor M2, a first bulk control element 110, a second bulk control element 120, a first gate control element 130, and a second gate control element 140. In addition, the charging unit 100 may further include a first boosting capacitor C1 and a second boosting capacitor C2.

One end ND1 of the first boosting capacitor C1 may be connected to the first gate control element 130, and the first clock signal CLK1 may be applied to the other end of the first boosting capacitor C1. In addition, one end ND2 of the second boosting capacitor C2 may be connected to the second gate control element 140, and the second clock signal CLK2 may be applied to the other end of the second boosting capacitor C2.

The input voltage VIN may be applied to one end of the first n-type transistor M1 and the other end of the first n-type transistor M1 may be connected to the first node N1. In addition, the first n-type transistor M1 may be connected to the first bulk control element 110 via one end and the other end (a source and a drain) of the first n-type transistor M1, and a gate of the first n-type transistor M1 may be connected to the first gate control element 130.

The first bulk control element 110 may include cross-coupled bulk control transistors (MK1 and MQ1) between the one end and the other end (the source and the drain) of the first n-type transistor M1. For example, the bulk control transistors (MK1 and MQ1) may be n-type transistors having bulks thereof connected to a bulk DN1 of the first n-type transistor M1. The first bulk control element 110 may control a voltage applied to each of the drain, the source, and the bulk of the first n-type transistor M1 by configuring feedback with the source, the drain, and the bulk of the first n-type transistor M1. For example, the first bulk control element 110 may control a bulk voltage of the first n-type transistor M1 to be maintained below a drain voltage and a source voltage. In other words, the first bulk control element 110 may control a voltage applied to the bulk DN1 to be maintained at the lowest level among the voltages applied to respective nodes of the first n-type transistor M1.

The first gate control element 130 may include the gate and the drain thereof connected to the one end ND1 of the first boosting capacitor C1 and may include the first control transistor MD1 to which the source thereof is connected. The first control transistor MD1 having a bulk thereof connected to the bulk DN1 of the first n-type transistor M1 may be an n-type transistor.

In an example embodiment, the first control transistor MD1 may have a width/length (W/L) ratio that is approximately the same as the W/L ratio of the first n-type transistor M1. For example, the first control transistor MD1 and the first n-type transistor M1 may have approximately the same size. Because the first control transistor MD1 and the first n-type transistor M1 have the same W/L ratio, the first control transistor MD1 and the first n-type transistor M1 may be transistors having the same threshold voltage.

For example, in response to activation of the first clock signal CLK1, the first n-type transistor M1 and the first control transistor MD1 may be turned on. A gate voltage of the first n-type transistor M1 may vary according to the first clock signal CLK1, and, accordingly, the first n-type transistor M1 may operate as a switch. Thus, as the first clock signal CLK1 is activated, the input voltage VIN may be applied to the first node N1.

For example, in response to deactivation of the first clock signal CLK1, the first n-type transistor M1 and the first control transistor MD1 may be turned off. As the first n-type transistor M1 operating as a switch is turned off, the first node N1 may be separated from the input terminal. For example, the voltage of the first node N1 and a gate voltage of the first control transistor MD1 may be different from each other by the threshold voltage of the first control transistor MD1.

The input voltage VIN may be applied to one end of the second n-type transistor M2 and the other end thereof may be connected to the second node N2. In addition, the second n-type transistor M2 may be connected to the second bulk control element 120 via the one end and the other end (a source and a drain) of the second n-type transistor M2, and a gate of the second n-type transistor M2 may be connected to the second gate control element 140.

The second bulk control element 120 may include cross-coupled bulk control transistors (MK2 and MQ2) between one end and the other end (the source and the drain) of the second n-type transistor M2. For example, the bulk control transistors (MK2 and MQ2) having a bulk thereof connected to the bulk DN2 of the second n-type transistor M2 may be n-type transistors. The second bulk control element 120 may control a voltage applied to each of the drain, the source, and the bulk of the second n-type transistor M2 by configuring feedback with the source, the drain, and the bulk of the second n-type transistor M2. For example, the second bulk control element 120 may control a bulk voltage of the second n-type transistor M2 to be maintained below the drain and source voltages.

The second gate control element 140 may include a gate and a drain thereof connected to one end ND2 of the second boosting capacitor C2, and may include a second control transistor MD2 having a source thereof connected to the second node N2. The second control transistor MD2 having a bulk thereof connected to the bulk DN2 of the second n-type transistor M2 may be an n-type transistor.

In an example embodiment, the second control transistor MD2 may have a width/length (W/L) ratio that is approximately the same as the W/L ratio of the second n-type transistor M2. For example, the second control transistor MD2 and the second n-type transistor M2 may have approximately the same size. Because the second control transistor MD2 and the second n-type transistor M2 have the same W/L ratio, the second control transistor MD2 and the second n-type transistor M2 may be transistors having the same threshold voltage.

For example, in response to activation of the second clock signal CLK2, the second n-type transistor M2 and the second control transistor MD2 may be turned on. The gate voltage of the second n-type transistor M2 may vary according to the second clock signal CLK2, and, accordingly, the second n-type transistor M2 may operate as a switch. Thus, as the second clock signal CLK2 is activated, the input voltage VIN may be applied to the second node N2.

For example, in response to deactivation of the second clock signal CLK2, the second n-type transistor M2 and the second control transistor MD2 may be turned off. As the second n-type transistor M2 operating as a switch is turned off, the second node N1 may be separated from the input terminal. For example, the voltage of the second node N2 and the gate voltage of the second control transistor MD2 may be different from each other by the threshold voltage of the second control transistor MD2.

Figure 3:
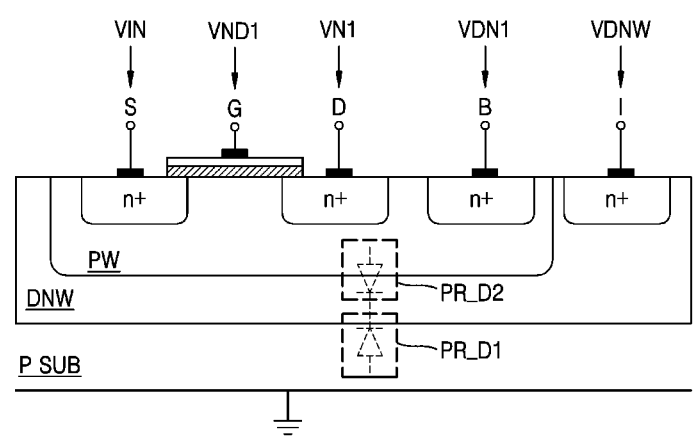
FIG. 3 illustrates a cross-sectional view of an n-type transistor according to some embodiments of the inventive concept.

FIG. 3 illustrates a cross-sectional view of an n-type transistor according to some embodiments of the inventive concept. For example, FIG. 3 may be a cross-sectional view of at least one of the first n-type transistor M1 and the second n-type transistor M2 in FIG. 2.

Referring to FIG. 3, a deep n-type well DNW may be formed on a p-type semiconductor substrate P_SUB, and a p-type well PW may be formed in a portion of the deep n-type well DNW. For example, the first and second bulks DN1 and DN2 of the first and second n-type transistors M1 and M2, respectively, may be implemented as the p-type well PW. The input voltage VIN, the gate voltage VND1, and the first node voltage VN1 may be applied to the source S, the gate G, and the drain D formed in the p-type well PW, respectively, and a bulk voltage VDN1 may be applied to the p-type well PW. In addition, the deep n-type well voltage VDNW may be applied to the deep n-type well DNW, and a ground voltage may be applied to the p-type semiconductor substrate P_SUB.

In an example embodiment, during the negative charge pump operation, the deep n-type well voltage VDNW may be greater than or equal to the ground voltage. In addition, during the negative charge pump operation, the deep n-type well voltage VDNW may be greater than or equal to the bulk voltage VDN1.

For example, during the negative charge pump operation, a negative voltage may be applied to the p-type well PW as the bulk voltage VDN1, and a positive voltage of the deep n-type well voltage VDNW may be applied to the deep n-type well DNW. Thus, a reverse bias may occur in a second parasitic diode PR_D2 formed between the p-type well PW and the deep p-type well DNW. In addition, because the ground voltage is applied to the p-type semiconductor substrate P_SUB, a reverse bias may also occur in a first parasitic diode PR_D1 formed between the p-type semiconductor substrate P_SUB and the deep n-type well DNW. Thus, the first and second n-type transistors M1 and M2, according to some example embodiments of the inventive concept, may reduce the body effect during the negative charge pump operation and also improve the efficiency of the charge pump operation.

Figure 4A:
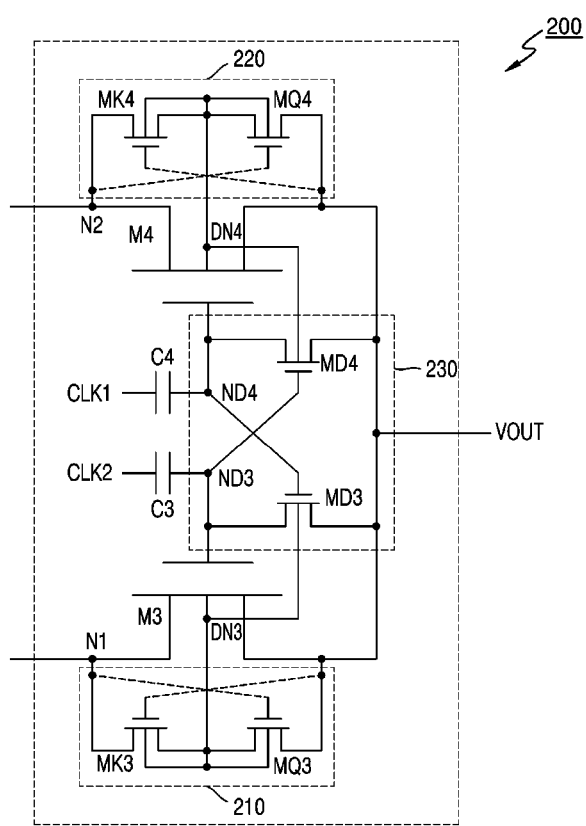
FIGS. 4A through 4C illustrate detailed circuit diagrams of output units according to some embodiments of the inventive concept, respectively.
Figure 4B:
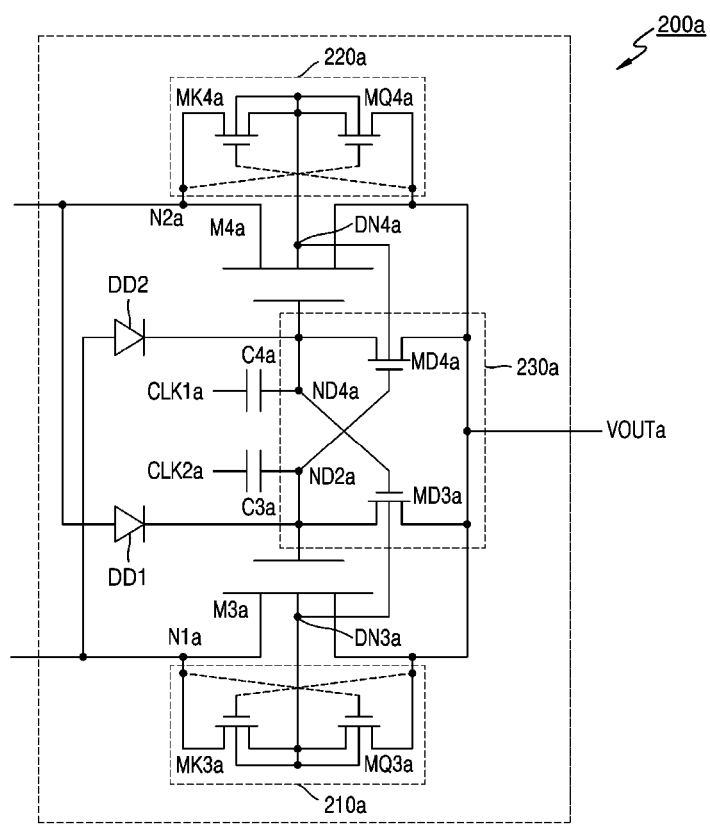
Figure 4C:
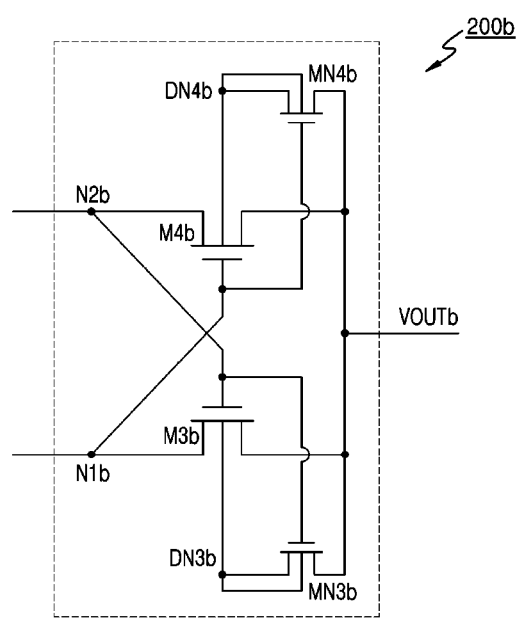

FIGS. 4A through 4C illustrate detailed circuit diagrams of output units 200, 200a, and 200b according to some embodiments of the inventive concept, respectively. Each of FIGS. 4A through 4C may be, for example, a circuit diagram for the output unit 200 in FIG. 1.

Referring to FIG. 4A, the output unit 200 may include a third N-type transistor M3, a fourth n-type transistor M4, a third bulk control element 210, a fourth bulk control element 220, and a gate control element 230. In addition, the output unit 200 may further include a third boosting capacitor C3 and a fourth boosting capacitor C4. The third and fourth bulk control elements 210 and 220 may have similar structures to those of the first and second bulk control elements 110 and 120 described with reference to FIG. 2, respectively, and, thus, a duplicate description thereof is omitted.

One end of the third n-type transistor M3 may be connected to the first node N1, and the other one thereof may be connected to the output terminal. In addition, the third n-type transistor M3 may be connected to the third bulk control element 210 via the one end and the other end (a source and a drain) of the third n-type transistor M3, and a gate of the third n-type transistor M3 may be connected to the gate control element 230.

One end of the fourth n-type transistor M4 may be connected to the second node N2, and the other end thereof may be connected to the output terminal. In addition, the fourth n-type transistor M4 may be connected to the fourth bulk control element 220 via the one end and the other end (a source and a drain) of the fourth n-type transistor M4, and a gate of the fourth n-type transistor M4 may be connected to the gate control element 230.

The gate control element 230 may include a third control transistor MD3 and a fourth control transistor MD4, which are cross-coupled to each other. One end of the third control transistor MD3 may be connected to one end ND3 of the third boosting capacitor C3, and the other end of the third control transistor MD3 may be connected to the output terminal. In addition, a bulk of the third control transistor MD3 may be connected to a bulk DN3 of the third n-type transistor M3. In addition, a gate of the third control transistor MD3 may be connected to one end ND4 of the fourth boosting capacitor C4.

One end of the fourth control transistor MD4 may be connected to the one terminal ND4 of the fourth boosting capacitor C4, and the other terminal of the fourth control transistor MD4 may be connected to the output terminal. In addition, a bulk of the fourth control transistor MD4 may be connected to a bulk DN4 of the fourth n-type transistor M4. In addition, a gate of the fourth control transistor MD4 may be connected to the one terminal ND3 of the third boosting capacitor C3.

In the example embodiment, the third and fourth control transistors MD3 and MD4 may have approximately the same W/L ratio as the third and fourth n-type transistors M3 and M4, respectively. For example, the third and fourth control transistors MD3 and MD4 may have approximately the same size as the third and fourth n-type transistors M3 and M4, respectively. Because the third control transistor MD3 and the third n-type transistor M3 have the same W/L ratio, the fourth control transistor MD4 and the fourth n-type transistor M4 may be transistors having the same threshold voltage.

In an example embodiment, the first clock signal CLK1 and the second clock signal CLK2 may be complementary. For example, in response to the activation of the first clock signal CLK1 (or the deactivation of the second clock signal CLK2), the fourth n-type transistor M4 may be turned on and the third n-type transistor M3 may be turned off. The fourth n-type transistor M4 may have a gate voltage that varies according to the activated first clock signal CLK1, and, thus, may operate as a turned-on switch. Thus, as the first clock signal CLK1 is activated, the voltage applied to the second node N2 may be output via the output terminal. In addition, the third N-type transistor M3 may have a gate voltage that varies according to the deactivated second clock signal CLK2, and, accordingly, may, as a turned-off switch, separate the first node N1 and the output terminal.

For example, in response to the activation of the second clock signal CLK2 (or the deactivation of the first clock signal CLK1), the third n-type transistor M3 may be turned on and the fourth n-type transistor M4 may be turned off. The third n-type transistor M3 may have a gate voltage that varies according to the activated second clock signal CLK2, and accordingly, may operate as a turned-on switch. Thus, as the second clock signal CLK2 is activated, the voltage applied to the first node N1 may be output via the output terminal VOUT. In addition, the fourth n-type transistor M4 may have a gate voltage that varies according to the deactivated first clock signal CLK1, and accordingly, may operate as a turned-off switch, separate the second node N2 and the output terminal.

The gate control element 230 may, by configuring feedback with the gates of the third and fourth n-type transistors M3 and M4, control a turned-on/turned-off state of each n-type transistor to be maintained when each of the first and second clock signals CLK1 and CLK2 are activated. For example, when the first clock signal CLK1 is activated, the gate control element 230 may control the turned-on state of the fourth n-type transistor M4 and the turned-off state of the third n-type transistor M3 to be maintained. In addition, when the second clock signal CLK2 is activated, the gate control element 230 may control the turned-on state of the third n-type transistor M3 and the turned-off state of the fourth n-type transistor M4 to be maintained.

Referring to FIG. 4B, the output unit 200a may further include a first diode DD1 and a second diode DD2. In an example embodiment, one end of the first diode DD1 may be connected to a second node N2a, and the other end of the first diode DD1 may be connected to a gate of a third n-type transistor M3a. In addition, one end of the second diode DD2 may be connected to a first node N1a, and the other end of the second diode DD2 may be connected to a gate of a fourth n-type transistor M4a.

Each of the first diode DD1 and the second diode DD2 may control a more complete switching of gate voltages of the third and fourth n-type transistors M3a and M4a. For example, when a second clock signal CLK2a changes from a deactivated state to an activated state, a rapid switching of the third n-type transistor M3a may be performed according to a connection of the first diode DD1. In addition, when a first clock signal CLK1a changes from a deactivated state to an activated state, a rapid switching of the fourth n-type transistor M4a may be performed according to a connection of the second diode DD2.

Referring to FIG. 4C, the output unit 200b may include a third n-type transistor M3b, a fourth n-type transistor M4b, a third gate control transistor MN3b, and a fourth gate control transistor MN4b. The third and fourth n-type transistors M3b and M4b may be cross-coupled between a first node N1b, a second node N2b, and an output terminal. In other words, the third n-type transistor M3b may be connected between the first node N1b and the output terminal, and a gate thereof may be connected to the second node N2b. In addition, the fourth n-type transistor M4b may be connected between the second node N2b and the output terminal, and a gate thereof may be connected to the first node N1b.

A gate of the third gate control transistor MN3b may be connected to a gate of the third n-type transistor M3b, one end and a bulk of the third gate control transistor MN3b may be connected to a bulk DN3b of the third n-type transistor M3b while the other end of the third gate control transistor MN3b is connected to the output terminal. In addition, the gate of the fourth gate control transistor MN4b may be connected to the gate of the fourth n-type transistor M4b, one end and a bulk of the fourth gate control transistor MN4b may be connected to a bulk DN4b of the fourth n-type transistor M4b while the other end of the fourth gate control transistor MN4b is connected to the output terminal.

Figure 5A:
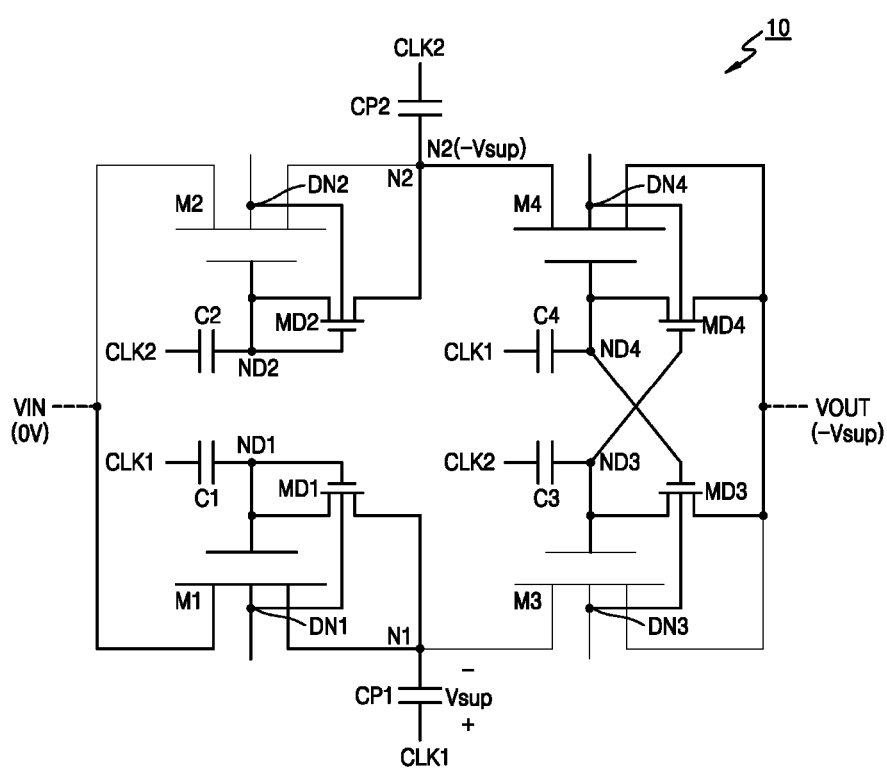
FIGS. 5A and 5B illustrate circuit diagrams for describing operations of a charge pump according to some embodiments of the inventive concept, respectively.
Figure 5B:
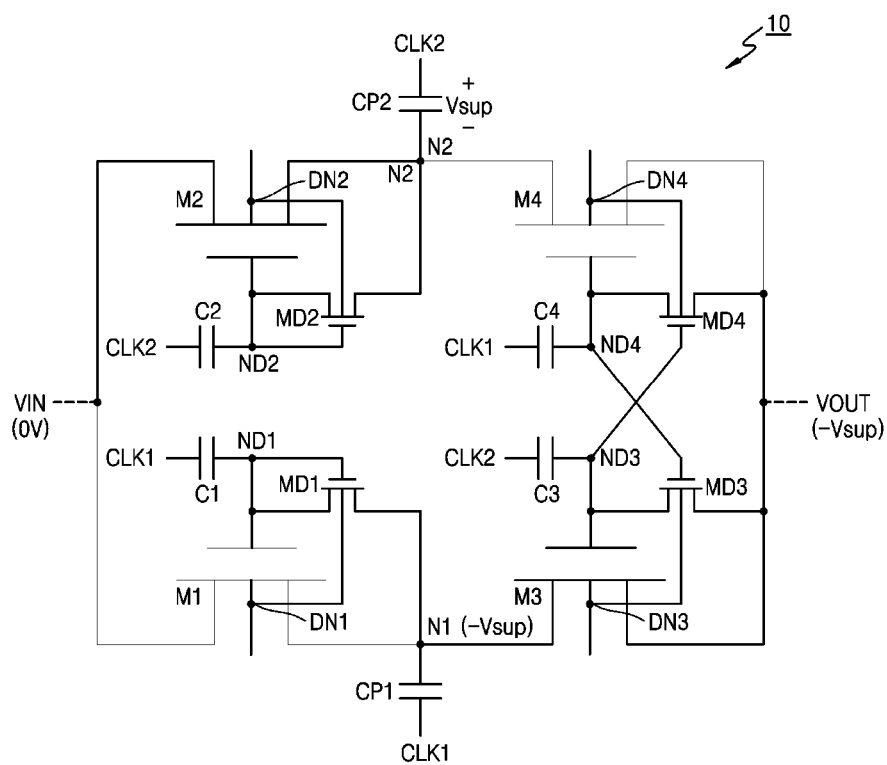

FIGS. 5A and 5B illustrate circuit diagrams for describing operations of a charge pump according to some embodiments of the inventive concept, respectively. In an example embodiment, the first and second clock signals CLK1 and CLK2 are complementary, FIG. 5A illustrates a circuit diagram as the first clock signal CLK1 is activated. In addition, FIG. 5B illustrates a circuit diagram as the second clock signal CLK2 is activated. For convenience of explanation, the configurations of the first and second bulk control elements (110 and 120 in FIG. 2, and 210 and 220 in FIG. 4A) provided in the charging unit 100 and the output unit 200 are omitted, but a detailed description thereof is given.

Referring to FIG. 5A, as the first clock signal CLK1 is activated, the first n-type transistor M1 and the fourth n-type transistor M4 may be turned on, and the second n-type transistor M2 and the third n-type transistor M3 may be turned off. In other words, as the first clock signal CLK1 is activated, a path connecting the input terminal to the first node N1 may be formed. Further, as the first clock signal CLK1 is activated, a path connecting the second node N2 and the output terminal may be formed. Accordingly, the first pumping capacitor CP1 may be charged as the input voltage VIN is applied, and a voltage that has been charged in the second pumping capacitor CP2 may be discharged as the output voltage VOUT.

For example, in the negative charge pump operation, when the first and second clock signals CLK1 and CLK2 vary between about 0 and a power supply voltage Vsup and the input voltage VIN is about 0 V, as the first clock signal CLK1 is activated (for example, to the power supply voltage Vsup), the first pumping capacitor CP1 may be charged to a negative value of the power supply voltage −Vsup. As the third n-type transistor M3 is turned off based on the second clock signal CLK2, the first node N1 and the output terminal may be separated.

As the second clock signal CLK2 is deactivated, a node voltage of the second node N2 connected to the second pumping capacitor CP2, which has been charged to the negative value of the power supply voltage −Vsup, may transition to the negative value of the power supply voltage −Vsup. As the fourth n-type transistor M4 is turned on based on the first clock signal CLK1, the output voltage VOUT may be generated as the negative value of the power supply voltage −Vsup.

Referring to FIG. 5B, as the second clock signal CLK2 is activated, the second n-type transistor M2 and the third n-type transistor M3 may be turned on, and the first n-type transistor M1 and the fourth n-type transistor M4 may be turned off. In other words, as the second clock signal CLK2 is activated, a path connecting the input terminal to the second node N2 may be formed. In addition, as the second clock signal CLK2 is activated, a path connecting the first node N1 to the output terminal may be formed. Accordingly, the second pumping capacitor CP2 may be charged as the input voltage VIN is applied, and the voltage charged in the first pumping capacitor CP1 may be discharged as the output voltage VOUT.

For example, in the negative charge pump operation, as the second clock signal CLK2 is activated, the second pumping capacitor CP2 may be charged to the negative value of the power supply voltage −Vsup. As the fourth n-type transistor M4 is turned off based on the first clock signal CLK1, the second node N2 and the output terminal may be separated.

As the first clock signal CLK1 is deactivated, the node voltage of the first node N1 connected to the first pumping capacitor CP1, which has been charged to the negative value of the power supply voltage −Vsup, may be transition to the negative value of the power supply voltage −Vsup. As the third n-type transistor M3 is turned on based on the second clock signal CLK2, the output voltage VOUT may be generated as the negative value of the power supply voltage −Vsup that is the node voltage of the first node N1.

Figure 6:
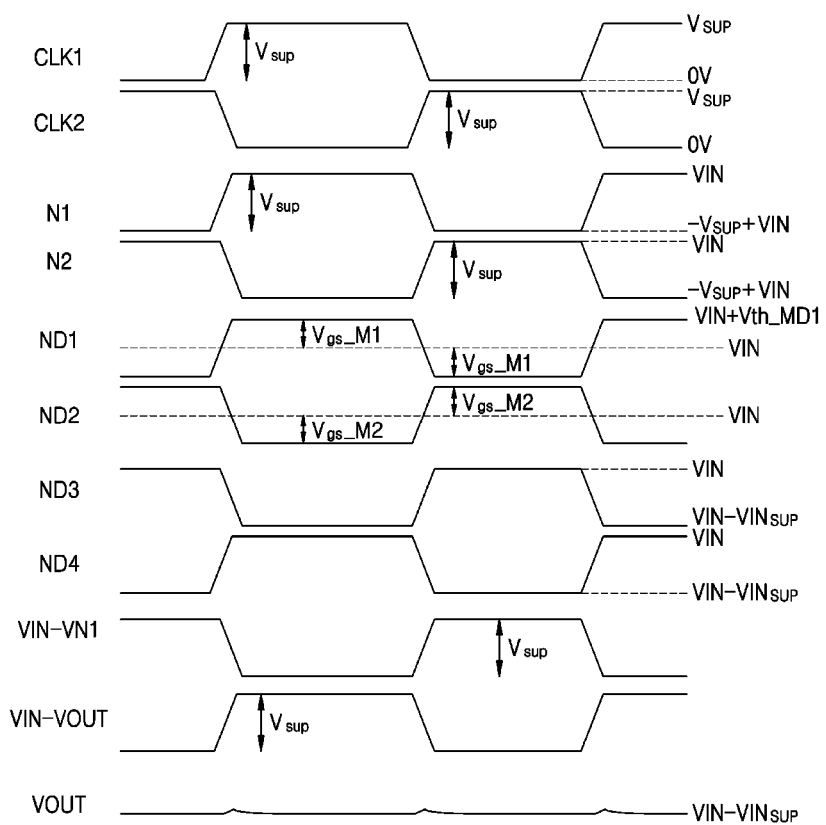
FIG. 6 illustrates timing diagrams for respective voltages of a charge pump circuit according to some embodiments of the inventive concept.

FIG. 6 illustrates timing diagrams for respective voltages of a charge pump circuit according to some embodiments of the inventive concept. Hereinafter, FIG. 6 is described with reference to FIGS. 5A and 5B.

Referring to FIG. 6, the first clock signal CLK1 and the second clock signal CLK2 may be complementary. At a time of deactivation, the first and second clock signals CLK1 and CLK2 may be different by the power supply voltage Vsup from the first and second clock signals CLK1 and CLK2 at a time of activation, respectively. In an example embodiment, each of the first and second clock signals CLK1 and CLK2 may be about 0 V at the time of deactivation, and each of the first and second clock signals CLK1 and CLK2 may be the power supply voltage Vsup at the time of activation. For example, the power supply voltage Vsup may be a voltage output from a power supply provided outside the charge pump 10, or may be a voltage output from a power supply provided inside the charge pump 10. In other words, the power supply voltage Vsup may be referred to as a voltage drain drain (VDD).

As the first clock signal CLK1 is activated, the first n-type transistor M1 may be turned on, and, thus, the voltage of the first node N1 may rise to the input voltage VIN. In addition, as the first clock signal CLK1 is deactivated, the first n-type transistor M1 may be turned off, and, thus, the voltage of the first node N1 may fall to a sum of the negative value of the power supply voltage −Vsup and the input voltage VIN. In other words, the voltage of the first node N1 when the first clock signal CLK1 is activated and the voltage of the first node N1 when the first clock signal CLK1 is deactivated may be different from each other by the power supply voltage Vsup.

In addition, as the first clock signal CLK1 is activated, the voltage at the one end ND1 of the first boosting capacitor C1 may rise to a sum of the input voltage VIN and a threshold voltage Vth MD1 of the first control transistor MD1. In other words, the one end ND1 of the first boosting capacitor C1 may rise/fall by a gate-source voltage Vgs_M1 of the first n-type transistor M1 according to a rising/falling of the first clock signal CLK1 based on the input voltage VIN.

As the second clock signal CLK2 is activated, the second n-type transistor M2 may be turned on, and, thus, the voltage of the second node N2 may rise to the input voltage VIN. In addition, as the second clock signal CLK2 is deactivated, the second n-type transistor M2 may be turned off, and, thus, the voltage of the second node N2 may decrease to a sum of the negative power supply voltage −Vsup and the input voltage VIN. In other words, the voltage of the second node N2 when the second clock signal CLK2 is activated and the voltage of the second node N2 when the second clock signal CLK2 is deactivated may be different from each other by the power supply voltage Vsup.

In addition, as the second clock signal CLK2 is activated, the voltage at the one end ND2 of the second boosting capacitor C2 may rise to a sum of the input voltage VIN and a threshold voltage Vth_MD2 of the second control transistor MD2. In other words, the one end ND2 of the second boosting capacitor C2 may rise/fall by a gate-source voltage Vgs_M2 of the second n-type transistor M2 according to the rising/falling of the second clock signal CLK2 based on the input voltage VIN.

According to the activation/deactivation of the first clock signal CLK1 (or, the deactivation/activation of the second clock signal CLK2), the one end ND3 of the third boosting capacitor C3 and the one end ND4 of the fourth boosting capacitor C4 may complementarily vary. As the first clock signal CLK1 rises (the second clock signal CLK2 rises), the voltage at the one end ND3 of the third boosting capacitor C3 may fall from the input voltage VIN to the sum of the input voltage VIN and the negative value of the power supply voltage −Vsup, and the one end ND4 of the fourth boosting capacitor C4 may rise from the sum of the input voltage VIN and the negative value of the power supply voltage −Vsup to the input voltage VIN. In addition, as the first clock signal CLK1 falls (or the second clock signal CLK2 rises), the voltage of the one end ND3 of the third boosting capacitor C3 may rise from the sum of the input voltage VIN and the negative value of the power supply voltage −Vsup to the input voltage VIN, and the voltage of the one end ND4 of the fourth boosting capacitor C4 may fall from the input voltage VIN to the sum of the input voltage VIN and the negative value of the power supply voltage −Vsup. According to the above operation, the charge pump 10 may generate the sum of the input voltage VIN and the negative value of the power supply voltage −Vsup as the output voltage VOUT.

When the first clock signal CLK1 is activated (or the second clock signal CLK2 is deactivated), the difference between the voltage VN1 of the first node N1 and the output voltage VOUT may be a value of the power supply voltage Vsup (that is, VN1−VOUT=Vsup). In other words, when the first clock signal CLK1 is activated, in the third n-type transistor M3 connected between the first node N1 and the output terminal, a voltage drop of the power supply voltage Vsup may occur. Although not illustrated, when the first clock signal CLK1 is activated, in the second n-type transistor M2 connected between the input terminal and the second node N2, a voltage drop of the power supply voltage Vsup may also occur.

When the second clock signal CLK2 is activated (or the first clock signal CLK1 is deactivated), the difference between the input voltage VIN and the voltage VN1 of the first node N1 may be the value of the power supply voltage Vsup (that is, VIN−VN1=Vsup). In other words, when the second clock signal CLK2 is activated, in the first n-type transistor M1 connected between the input terminal and the first node N1, the voltage drop of the power supply voltage Vsup may occur. Although not illustrated, when the second clock signal CLK2 is activated, in the fourth n-type transistor M4 connected between the second node N2 and the output terminal, the voltage drop of the power supply voltage Vsup may also occur.

In a charge pump according to some embodiments of the inventive concept, when a clock signal activated by a power supply voltage Vsup, which is a power voltage, is applied, only a voltage that is equal to or less than the power supply voltage Vsup may be applied to each of transistors (for example, M1 through M4). Accordingly, the charge pump according to some embodiments of the inventive concept may sufficiently realize a charge pump operation by using only a low voltage transistor without using a separate high voltage transistor as a switch. As a result, a charge pump circuit may be implemented even with a small area, and thus the degree of integration may be improved.

Figure 7:
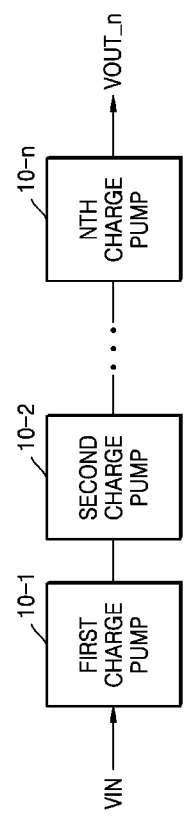
FIG. 7 illustrates a block diagram for describing generation of an output voltage through a multiple of charge pumps according to some embodiments of the inventive concept.

FIG. 7 illustrates a block diagram that illustrates generation of an output voltage VOUT_n (n is a positive integer) through first through $n^{th}$ charge pumps 10-1 through 10-n according to an embodiment.

Referring to FIG. 7, n charge pumps (10-1 through 10-n) may be sequentially operated responsive to the input voltage VIN, and finally the output voltage VOUT n may be generated. In an example embodiment, each of the first through $n^{th}$ charge pumps 10-1 through 10-n may be the charge pump 10 described with reference to FIGS. 1 through 6.

For example, when the input voltage VIN is about 0 V, a capacitance of each charge pump is C, a parasitic capacitance due to switching of each charge pump is Cp, an output current is Iload, and the frequency of a clock signal is f, an $n^{th}$ output voltage VOUT n may be defined by Formula 1 below.

$$\text{VOUT-}n = -n(C/(C+Cp))\text{Vup} + (n \times \text{Iload})/(f(C+Cp)) \quad \text{[Formula 1]}$$

From Formula 1, the number n of charge pumps for obtaining the targeted output voltage VOUT n may be defined by Formula 2 below.

$$n = (\text{VOUT-}n)/((-C/(C+Cp))\text{Vsup} + \text{Iload}/(f(C+Cp))) \quad \text{[Formula 2]}$$

Referring to Formula 2, when the capacitance C and the parasitic capacitance Cp are constant, the required number n of charge pumps may be reduced as the power supply voltage Vsup increases or the parasitic capacitance Cp decreases. Because only the voltage of the power supply voltage Vsup is applied to the transistors responsible for the switching, a charge pump according to some embodiments of the inventive concept may perform a charge pump operation at a high level of the power supply voltage Vsup while the reliability of a circuit thereof is maintained. Accordingly, because the targeted output voltage VOUT n is obtained with a reduced number n of charge pumps, the integration degree may be improved.

Figure 8:
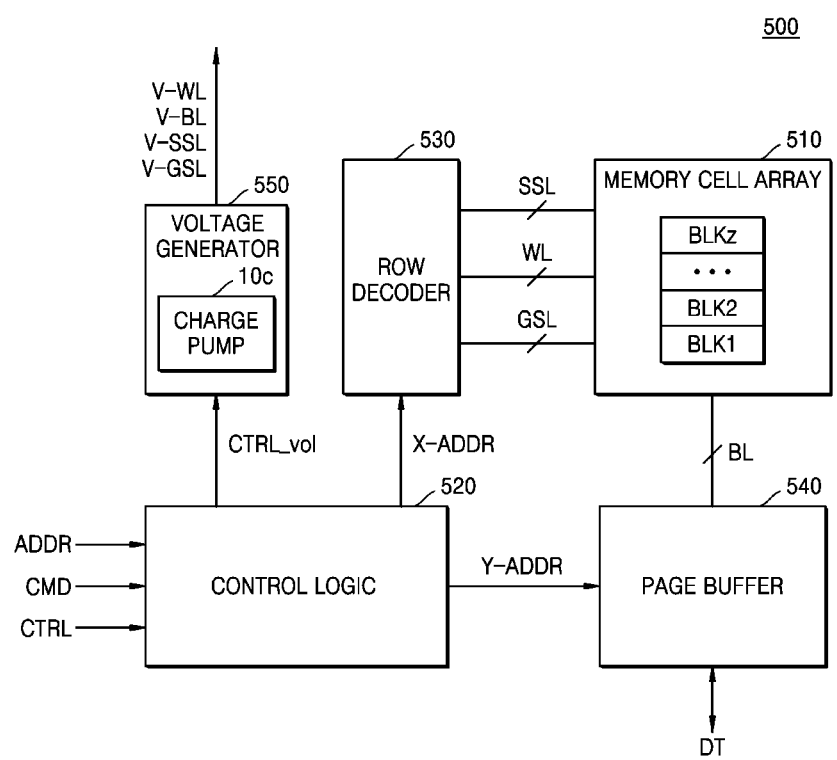
FIG. 8 illustrates a block diagram of a memory device including a charge pump according to some embodiments of the inventive concept.

FIG. 8 illustrates a block diagram of a memory device 500 incorporating a charge pump 10c according to some embodiments of the inventive concept.

Referring to FIG. 8, the memory device 500 may include a memory cell array 510, a control logic 520, a row decoder 530, a page buffer 540, and a voltage generator 550. Although not illustrated in FIG. 8, the memory device 500 may further include a data input/output circuit, an input/output interface, etc. In addition, although not illustrated in FIG. 8, the memory device 500 may further include various sub-circuits, such as an error correction circuit for correcting errors of data read from the memory cell array 510.

The memory cell array 510 may include a plurality of memory cells and may be connected to string selection lines SSL, word lines WL, ground selection lines GSL, and bit lines BL. The memory cell array 510 may be connected to the row decoder 530 via the string select lines SSL, the word lines WL, and the ground select lines GSL and may be connected to the page buffer 540 via the bit lines BL.

For example, the plurality of memory cells included in the memory cell array 510 may be nonvolatile memory cells that retain stored data even when supplied power is interrupted. For example, when the memory cell is a nonvolatile memory cell, the memory device 500 may be an electrically erasable programmable read-only memory (RAM) (EEPROM), a flash memory, phase change random access memory (RAM) (PRAM), resistive ROM (RRAM), a nano-floating gate memory (NFGM), polymer RAM (PoRAM), magnetic RAM (MRAM), or ferroelectric RAM (FRAM) in accordance with various embodiments of the inventive concept. Hereinafter, embodiments of the inventive concept will be described by taking as an example a case in which the plurality of memory cells are NAND flash memory cells, but it will be understood that embodiments of the inventive concept are not limited thereto.

The memory cell array 510 may include a plurality of memory blocks BLK1 through BLKz, and each of the memory blocks BLK1 through BLKz may have a planar structure or a three-dimensional (3D) structure. The memory cell array 510 may include at least one of a single level cell block including single level cells (SLC), a multi-level cell block including multi-level cells (MLC), a triple level cell block including triple level cells (TLC), and a quad level cell block including quad level cells (QLC). For example, some of the plurality of memory blocks BLK1 through BLKz may be SLC memory blocks, while the other memory blocks may be MLC blocks, TLC blocks, or QLC blocks.

The control logic 520 may, based on a command CMD, an address ADDR, and a control signal CTRL, program data in the memory cell array 510, read data from the memory cell array 510, or output various control signals for erasing data stored in the memory cell array 510, for example, a voltage control signal CTRL_vol, a row address X-ADDR, and a column address Y-ADDR. For example, the control logic 520 may receive the command CMD, the address ADDR, and the control signal CTRL from a memory controller (not illustrated) outside the memory device 500. Thus, the control logic 520 may control all the various operations in the memory device 500.

The row decoder 530 may, in response to the row address X-ADDR, select one of the memory blocks BLK1 through BLKz, select one of the word lines WL of the selected memory block, and select one of the plurality of string selection lines SSL. In addition, the row decoder 530 may transmit a voltage for performing the memory operation to the word lines WL of the selected memory block. For example, when performing the erase operation, the row decoder 530 may transmit an erase voltage and a verify voltage to the selected word line WL, and a pass voltage to an unselected word line WL.

The page buffer 540 may transmit and/or receive data DT to and from the outside of the memory device 500. The page buffer 540 may select some of the bit lines BL in response to the column address Y-ADDR. The page buffer 540 may operate as a write driver or a sense amplifier.

The voltage generator 550 may generate various kinds of voltages for performing a program operation, a read operation, and an erase operation on the memory cell array 510 based on the voltage control signal CTRL_vol. The voltage generator 550 may generate a word line voltage V_WL, for example, a program voltage, a read voltage, a pass voltage, an erase verify voltage, or a program verify voltage. In addition, the voltage generator 550 may further generate a string selection line voltage V_SSL and a ground selection line voltage V_GSL based on the voltage control signal CTRL_vol.

In addition, the voltage generator 550 may further generate a bit line voltage V_BL based on the voltage control signal CTRL_vol. For example, the voltage generator 550 may generate a gate induced drain leakage (GIDL) voltage and an erase voltage as the bit line voltage V_BL.

The voltage generator 550 may further include the charge pump 10c. The charge pump 10c may perform the positive charge pump operation or the negative charge pump operation based on the voltage control signal CTRL_vol. According to the charge pump operation, the charge pump 10c may generate the program voltage or the erase voltage.

In an example embodiment, the charge pump 10c may be implemented by using the embodiments described with reference to FIGS. 1 through 9. Accordingly, the charge pump 10c may reduce the occurrence of the body effect even in the negative charge pump operation and may be realized with a small area. As a result, by using the charge pump 10c according to some embodiments of the inventive concept, the degree of integration of the memory device 500 may be improved.

Figure 9A:
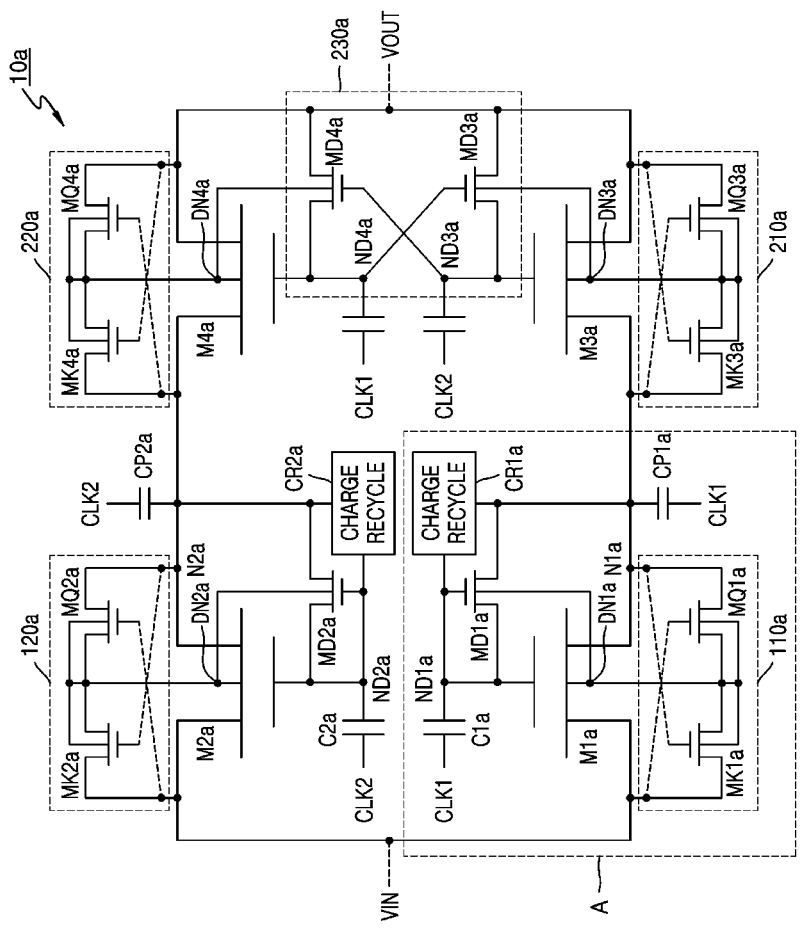
FIG. 9A illustrates a detailed circuit diagram of a charge pump according to some example embodiments of the inventive concept.
Figure 9B:
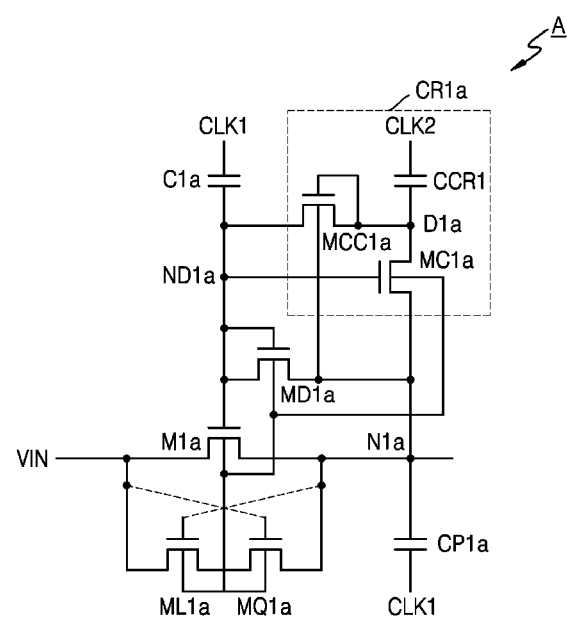
FIG. 9B illustrates a detailed circuit diagram of a region A in FIG. 9A.

FIG. 9A illustrates a detailed circuit diagram of a charge pump 10a according to some example embodiments of the inventive concept, and FIG. 9B illustrates a detailed circuit diagram of a region A in FIG. 9A. Among the configurations of FIGS. 9A and 9B, a description of the configurations described above is omitted.

Referring to FIG. 9A, the charge pump 10a may further include a first charge recycle circuit CR1a and a second charge recycle circuit CR2a. For example, the first charge recycle circuit CR1a may be connected to a first node N1a and one end ND1a of a first boosting capacitor C1a. In addition, the second charge recycle circuit CR2a may be connected to a second node N2a and one end ND2a of a second boosting capacitor C2a. In an example embodiment, the first charge recycle circuit CR1a may operate such that a first n-type transistor M1a is smoothly turned on when the first clock signal CLK1 is activated. In addition, the second charge recycle circuit CR2a may operate such a second n-type transistor M2a is smoothly turned on when the second clock signal CLK2 is activated. A detailed description thereof is given below with reference to FIGS. 9B and 10.

Referring further to FIG. 9B, the first charge recycle circuit CR1a may include a plurality of transistors MC1a and MCC1a and a capacitor CCR1. For example, the plurality of transistors MC1a and MCC1a and the capacitor CCR1 may share an absorbing node D1a. One end of the transistor MC1a may be connected to the first node N1a, the other end thereof may be connected to the absorbing node D1a, and a gate thereof may be connected to the one end ND1a of the first boosting capacitor C1a. In addition, one end of the transistor MCC1a may be connected to the one end ND1a of the first boosting capacitor C1a, and the other end and a gate thereof may be connected to the absorbing node D1a. In addition, the second clock signal CLK2 may be applied to one end of the capacitor CCR1, and the other end of the capacitor CCR1 may be connected to the absorbing node D1a. It may be sufficiently understood that although only a detailed configuration of the first charge recycle circuit CR1a is illustrated in FIG. 9B, the same/similar configuration is applicable to the second charge recycle circuit CR2a.

Figure 10:
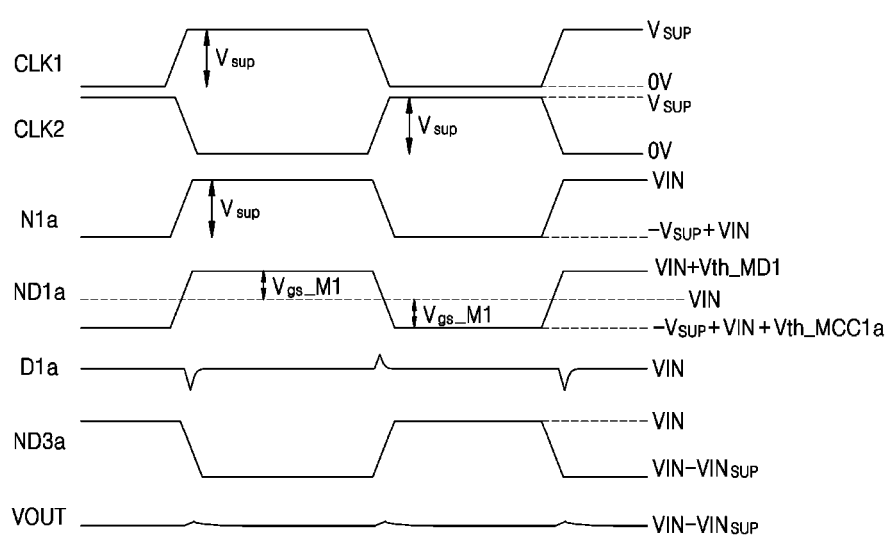
FIG. 10 illustrates timing diagrams of respective voltages for describing operations of charge recycle circuits in FIGS. 9A and 9B according to some embodiments of the inventive concept.

FIG. 10 illustrates timing diagrams of respective voltages for describing operations of the first and second charge recycle circuits CR1a and CR2a in FIGS. 9A and 9B according to some embodiments of the inventive concept. Among the configurations illustrated in FIG. 10, duplicate descriptions of configurations given with reference to FIG. 6 are omitted.

Referring to FIGS. 9B and 10, in an interval in which the first clock signal CLK1 is activated (or rises) (or the second clock signal CLK2 is deactivated), a voltage of the absorbing node D1a may fall to a certain level and then rise back to an original state. For example, as the first clock signal CLK1 rises, a voltage of the first node N1a may also rise. Thus, a magnitude of a voltage between a gate and a source of the first n-type transistor M1a may be reduced, and, accordingly, may interfere with the turn-on of the first n-type transistor M1a. The charge pump 10a according to some embodiments of the inventive concept may smoothly perform a turn-on operation of the first n-type transistor M1a by including the charge recycle circuit CR1a and absorbing via the absorbing node D1a a pull-up of the first node N1a in response to the rise of the first clock signal CLK1.

Figure 11:
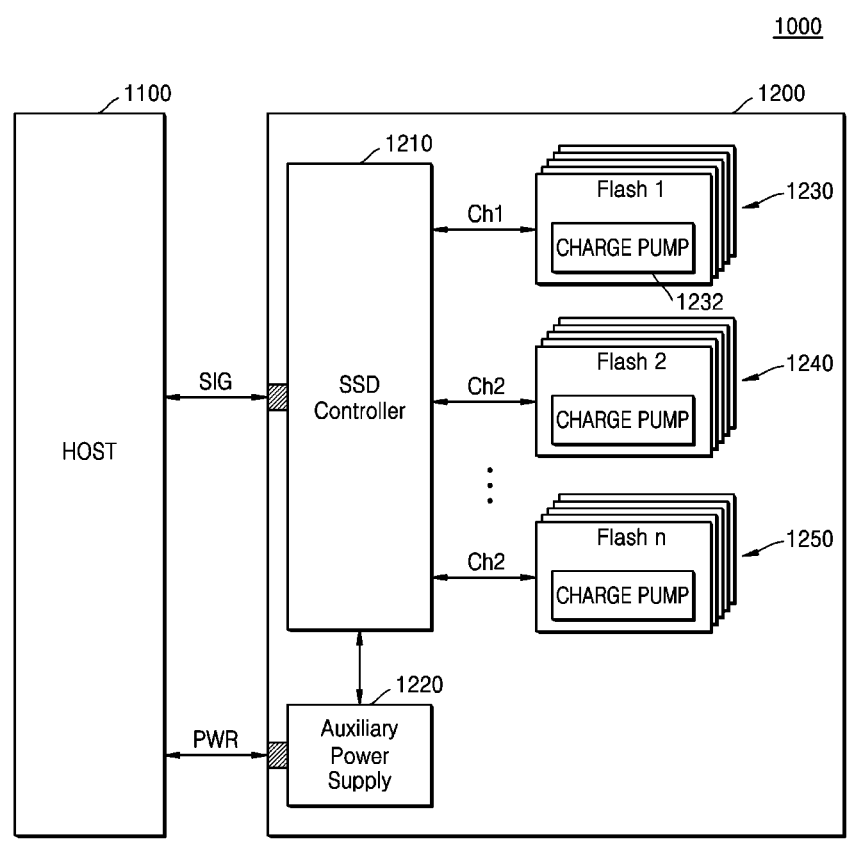
FIG. 11 is a block diagram illustrating an example in which memory devices including a charge pump according to some embodiments of the inventive concept are included in a solid state drive (SSD) system.

FIG. 11 is a block diagram illustrating an example in which memory devices using a charge pump 1232 according to some embodiments of the inventive concept are applied to a solid state drive (SSD) system.

Referring to FIG. 11, the SSD system 1000 may include a host 1100 and an SSD 1200. The SSD 1200 may exchange signals with the host 1100 via a signal connector and receive power via a power connector. The SSD 1200 may include an SSD controller 1210, an auxiliary power supply 1220, and memory devices 1230, 1240, and 1250. Here, the SSD 1200 may be implemented by using the embodiments described above with reference to FIGS. 1 through 10. Each of the memory devices 1230, 1240, and 1250 may include a charge pump 1232. Thus, the stability of a charge pump operation may be improved, and the degree of integration of each of the memory devices 1230, 1240 and 1250 may be improved as described herein.

Figure 12:
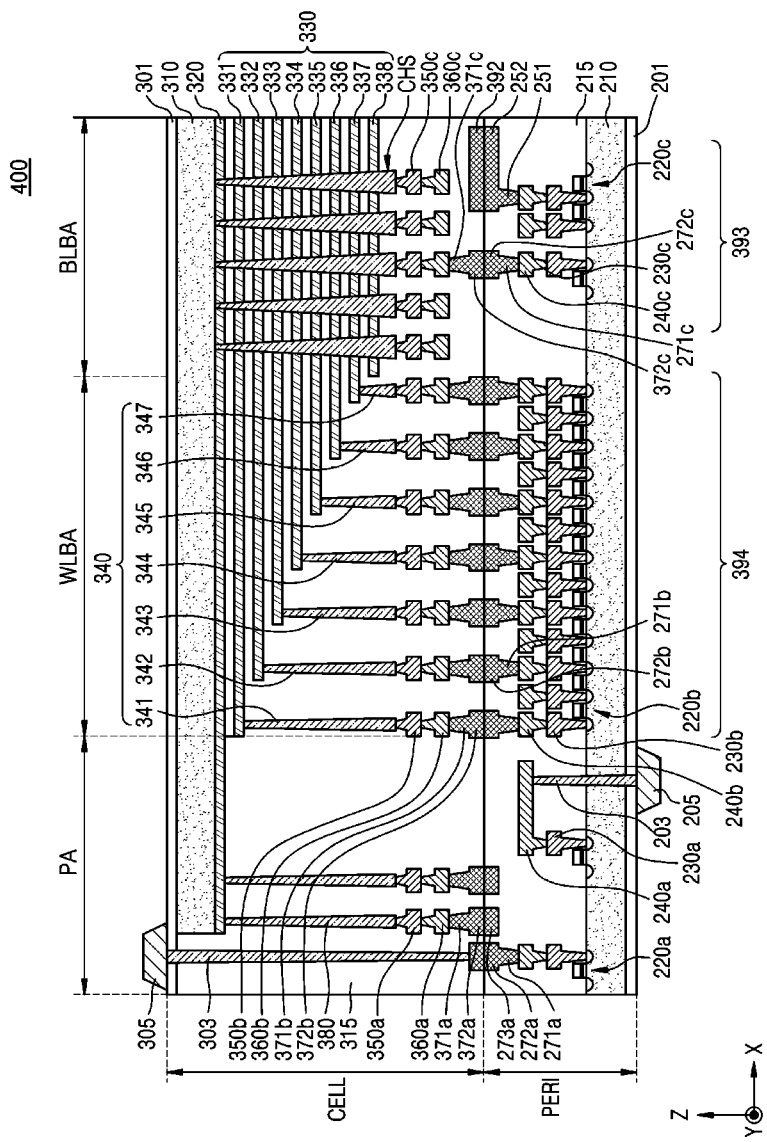
FIG. 12 illustrates a memory device having a chip-to-chip (C2C) structure, according to some embodiments of the inventive concept.

FIG. 12 illustrates a memory device having a chip-to-chip (C2C) structure, according to some embodiments of the inventive concept.

Referring to FIG. 12, a memory device 400 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals may be formed of copper (Cu), the bonding manner may be a Cu—Cu bonding, and the bonding metals may also be formed of aluminum or tungsten in other embodiments.

Each of the peripheral circuit region PERI and the cell region CELL of the memory device 40 may include an external pad bonding area PA, a word line bonding area WLBA, and a bit line bonding area BLBA.

The peripheral circuit region PERI may include a first substrate 210, an interlayer insulating layer 215, a plurality of circuit elements 220a, 220b, and 220c formed on the first substrate 210, first metal layers 230a, 230b, and 230c respectively connected to the plurality of circuit elements 220a, 220b, and 220c, and second metal layers 240a, 240b, and 240c formed on the first metal layers 230a, 230b, and 230c. In an example embodiment, the first metal layers 230a, 230b, and 230c may be formed of tungsten having relatively high resistance, and the second metal layers 240a, 240b, and 240c may be formed of copper having relatively low resistance.

In an example embodiment illustrated in FIG. 12, although the first metal layers 230a, 230b, and 230c and the second metal layers 240a, 240b, and 240c are shown and described, the number and type of layers are not limited thereto, and one or more metal layers may be further formed on the second metal layers 240a, 240b, and 240c. At least a portion of the one or more metal layers formed on the second metal layers 240a, 240b, and 240c may be formed of aluminum or the like having a lower resistance than those of copper forming the second metal layers 240a, 240b, and 240c.

The interlayer insulating layer 215 may be disposed or arranged on the first substrate 210 and may be on and at least partially cover the plurality of circuit elements 220a, 220b, and 220c, the first metal layers 230a, 230b, and 230c, and the second metal layers 240a, 240b, and 240c. The interlayer insulating layer 215 may include an insulating material, such as silicon oxide, silicon nitride, or the like.

Lower bonding metals 271b and 272b may be formed on the second metal layer 240b in the word line bonding area WLBA. In the word line bonding area WLBA, the lower bonding metals 271b and 272b in the peripheral circuit region PERI may be electrically connected to the lower bonding metal 271c in a bonding manner, and the lower bonding metals 271b and 272b and the upper bonding metals 371b and 372b may be formed of aluminum, copper, tungsten, or the like. Further, the upper bonding metals 371b and 372b in the cell region CELL may be referred as first metal pads and the lower bonding metals 271b and 272b in the peripheral circuit region PERI may be referred as second metal pads.

The cell region CELL may include at least one memory block. The cell region CELL may include a second substrate 310 and a common source line 320. On the second substrate 310, a plurality of word lines 331 to 338 (i.e., 330) may be stacked in a direction (a Z-axis direction), perpendicular to an upper surface of the second substrate 310. At least one string select line and at least one ground select line may be arranged on and below (with respect to the Z-direction) the plurality of word lines 330 in the cross-sectional view of FIG. 12, respectively, and the plurality of word lines 330 may be disposed or arranged between the at least one string select line and the at least one ground select line.

In the bit line bonding area BLBA, a channel structure CH may extend in a direction, perpendicular to the upper surface of the second substrate 310, and pass through the plurality of word lines 330, the at least one string select line, and the at least one ground select line. The channel structure CH may include a data storage layer, a channel layer, a buried insulating layer, and the like, and the channel layer may be electrically connected to a first metal layer 350c and a second metal layer 360c. For example, the first metal layer 350c may be a bit line contact, and the second metal layer 360c may be a bit line. In an example embodiment, the bit line 360c may extend in a first direction (a Y-axis direction), parallel to the upper surface of the second substrate 310.

In an example embodiment illustrated in FIG. 12, an area in which the channel structure CH, the bit line 360c, and the like are disposed may be defined as the bit line bonding area BLBA. In the bit line bonding area BLBA, the bit line 360c may be electrically connected to the circuit elements 220c providing a page buffer 393 in the peripheral circuit region PERI. For example, the bit line 360c may be connected to upper bonding metals 371c and 372c in the cell region CELL, and the upper bonding metals 371c and 372c may be connected to lower bonding metals 271c and 272c connected to the circuit elements 220c of the page buffer 393.

In the word line bonding area WLBA, the plurality of word lines 330 may extend in a second direction (an X-axis direction), parallel to the upper surface of the second substrate 310, and may be connected to a plurality of cell contact plugs 341 to 347 (i.e., 340). The plurality of word lines 330 and the plurality of cell contact plugs 340 may be connected to each other in pads provided by at least a portion of the plurality of word lines 330 extending in different lengths in the second direction. A first metal layer 350b and a second metal layer 360b may be connected to an upper portion of the plurality of cell contact plugs 340 connected to the plurality of word lines 330, sequentially. The plurality of cell contact plugs 340 may be connected to the circuit region PERI by the upper bonding metals 371b and 372b of the cell region CELL and the lower bonding metals 271b and 272b of the peripheral circuit region PERI in the word line bonding area WLBA.

The plurality of cell contact plugs 340 may be electrically connected to the circuit elements 220b providing a row decoder 394 in the peripheral circuit region PERI. In an example embodiment, operating voltages of the circuit elements 220b providing the row decoder 394 may be different than operating voltages of the circuit elements 220c providing the page buffer 393. For example, operating voltages of the circuit elements 220c providing the page buffer 393 may be greater than operating voltages of the circuit elements 220b providing the row decoder 394.

A common source line contact plug 380 may be disposed or arranged in the external pad bonding area PA. The common source line contact plug 380 may be formed of a conductive material, such as a metal, a metal compound, poly silicon, or the like, and may be electrically connected to the common source line 320. A first metal layer 350a and a second metal layer 360a may be stacked on an upper portion of the common source line contact plug 380, sequentially. For example, an area in which the common source line contact plug 380, the first metal layer 350a, and the second metal layer 360 are disposed or arranged may be defined as the external pad bonding area PA.

Input-output pads 205 and 305 may be disposed or arranged in the external pad bonding area PA. Referring to FIG. 12, a lower insulating film 201 on and at least partially covering a lower surface of the first substrate 210 may be formed below the first substrate 210, and a first input-output pad 205 may be formed on the lower insulating film 201. The first input-output pad 205 may be connected to at least one of the plurality of circuit elements 220a, 220b, and 220c disposed or arranged in the peripheral circuit region PERI through a first input-output contact plug 203, and may be separated from the first substrate 210 by the lower insulating film 201. In addition, a side insulating film may be disposed or arranged between the first input-output contact plug 203 and the first substrate 210 to electrically separate the first input-output contact plug 203 and the first substrate 210.

Referring to FIG. 12, an upper insulating film 301 on and least partially covering the upper surface of the second substrate 310 may be formed on the second substrate 310, and a second input-output pad 305 may be disposed or arranged on the upper insulating layer 301. The second input-output pad 305 may be connected to at least one of the plurality of circuit elements 220a, 220b, and 220c disposed or arranged in the peripheral circuit region PERI through a second input-output contact plug 303.

According to some embodiments, the second substrate 310 and the common source line 320 may not be disposed or arranged in an area in which the second input-output contact plug 303 is disposed or arranged. Also, the second input-output pad 305 may not overlap the word lines 330 in the third direction (the Z-axis direction). Referring to FIG. 12, the second input-output contact plug 303 may be separated from the second substrate 310 in a direction parallel to the upper surface of the second substrate 310, and may pass through the interlayer insulating layer 315 of the cell region CELL to be connected to the second input-output pad 305.

According to some embodiments, the first input-output pad 205 and the second input-output pad 305 may be selectively formed. For example, the memory device 400 may include only the first input-output pad 205 disposed or arranged on the first substrate 210 or the second input-output pad 305 disposed or arranged on the second substrate 310. In other embodiments, the memory device 400 may include both the first input-output pad 205 and the second input-output pad 305.

A metal pattern in an uppermost metal layer may be provided as a dummy pattern or the uppermost metal layer may be absent in each of the external pad bonding area PA and the bit line bonding area BLBA respectively included in the cell region CELL and the peripheral circuit region PERI.

In the external pad bonding area PA, the memory device 400 may include a lower metal pattern 273a, corresponding to an upper metal pattern 372a formed in an uppermost metal layer of the cell region CELL, and having the same shape as the upper metal pattern 372a of the cell region CELL, in an uppermost metal layer of the peripheral circuit region PERI. In the peripheral circuit region PERI, the lower metal pattern 273a formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 271b and 272b may be formed on the second metal layer 240b in the word line bonding area WLBA. In the word line bonding area WLBA, the lower bonding metals 271b and 272b of the peripheral circuit region PERI may be electrically connected to the upper bonding metals 371b and 372b of the cell region CELL by a Cu—Cu bonding.

Further, the bit line bonding area BLBA, an upper metal pattern 392, corresponding to a lower metal pattern 252 formed in the uppermost metal layer of the peripheral circuit region PERI, and having the same shape as the lower metal pattern 252 of the peripheral circuit region PERI, may be formed in an uppermost metal layer of the cell region CELL.

A contact may not be formed on the upper metal pattern 392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same shape as the metal pattern may be formed in an uppermost metal layer in another one of the cell region CELL and the peripheral circuit region PERI, and a contact may not be formed on the reinforcement metal pattern.

As described above, embodiments have been disclosed in the drawings and the specification. While the embodiments have been described herein with reference to specific terms, it should be understood that they have been used only for the purpose of describing the technical idea of the inventive concept and not for limiting the scope of the inventive concept as defined in the claims. Thus, those with ordinary skill in the art will appreciate that various modifications and equivalent embodiments are possible without departing from the scope of the inventive concept. Therefore, the true scope of protection of the inventive concept should be determined by the technical idea of the appended claims.

What is claimed is:

1. A memory device comprising:
a memory cell region including a first metal pad;
a peripheral circuit region including a second metal pad and vertically connected to the memory cell region by the first metal pad and the second metal pad;
a memory cell array in the memory cell region including a plurality of cell strings including a plurality of memory cells, a plurality of word lines respectively connected to the plurality of memory cells, a plurality of bit lines connected to one side of the plurality of cell strings, and a ground selection line connected to the plurality of cell strings;
a charging unit in the peripheral circuit region comprising a first n-type transistor connected between an input terminal configured to receive an input voltage and a first node, a second n-type transistor connected between the input terminal and a second node, a first gate control element configured to control the first n-type transistor based on a first clock signal, and a second gate control element configured to control the second n-type transistor based on a second clock signal having a phase opposite to the first clock signal;
a first pumping capacitor in the peripheral circuit region comprising one end connected to the first node and an other end configured to receive the first clock signal;
a second pumping capacitor in the peripheral circuit region comprising one end connected to the second node and an other end configured to receive the second clock signal; and
an output unit in the peripheral circuit region connected between the charging unit and an output terminal, the output unit configured to output a first voltage at the first node or a second voltage at the second node to the output terminal;
wherein a bulk of each of the first n-type transistor and the second n-type transistor is formed in a portion of a deep-n well formed on a p-type semiconductor substrate, and
wherein a voltage greater than or equal to a voltage applied to the p-type semiconductor substrate is applied to the deep-n well responsive to operation of the charge pump.

2. The memory device of claim 1, wherein the charging unit further comprises: a first boosting capacitor comprising one end connected to a gate of the first n-type transistor, the first boosting capacitor comprising an other end configured to receive the first clock signal; and a second boosting capacitor comprising one end connected to a gate of the second n-type transistor, the second boosting capacitor comprising an other end configured to receive the second clock signal.

3. The memory device of claim 2, wherein the first gate control element comprises a first control transistor comprising a gate and a drain connected to the one end of the first boosting capacitor, and a source connected to the first node.

4. The memory device of claim 3, wherein the first control transistor and the first n-type transistor have approximately identical width/length (W/L) ratios.

5. The memory device of claim 2, wherein the second gate control element comprises a second control transistor comprising a gate and a drain connected to the one end of the second boosting capacitor, and a source connected to the second node.

6. The memory device of claim 5, wherein the second control transistor and the second n-type transistor have approximately identical W/L ratios.

7. The memory device of claim 1, wherein the charging unit further comprises: a first bulk control transistor comprising one end connected to the input terminal, an other end connected to a bulk of the first n-type transistor, and a gate connected to the first node; and a second bulk control transistor comprising one end connected to the first node, an other end connected to the bulk of the first n-type transistor, and a gate connected to the input terminal.

8. The memory device of claim 1, wherein the output unit further comprises:
a third n-type transistor connected between the first node and the output terminal;
a fourth n-type transistor connected between the second node and the output terminal; and
a third gate control element configured to control gates of the third n-type transistor and the fourth n-type transistor based on the first clock signal and the second clock signal.

9. The memory device of claim 8, wherein the output unit further comprises: a third boosting capacitor comprising one end connected to the gate of the third n-type transistor and an other end configured to receive the second clock signal; and a fourth boosting capacitor comprising one end connected to the gate of the fourth n-type transistor and an other end configured to receive the first clock signal.

10. The memory device of claim 9, wherein the third gate control element comprises a third control transistor and a fourth control transistor, which are cross-coupled between the gates of the third n-type transistor and the fourth n-type transistor and the output terminal.

11. The memory device of claim 1, wherein the first metal pad and the second metal pad formed of copper.

12. The memory device of claim 1, wherein the first metal pad and the second metal pad are connected by bonding manner.

13. The memory device of claim 1, wherein the memory cell region is formed on a first wafer and the peripheral circuit region is formed on a second wafer.

14. A memory device comprising:
a memory cell region including a first metal pad;
a peripheral circuit region including a second metal pad and vertically connected to the memory cell region by the first metal pad and the second metal pad;

a memory cell array in the memory cell region including a plurality of cell strings including a plurality of memory cells, a plurality of word lines respectively connected to the plurality of memory cells, a plurality of bit lines connected to one side of the plurality of cell strings, and a ground selection line connected to the plurality of cell strings;

a first pumping capacitor in the peripheral circuit region comprising one end connected to a first node and an other end configured to receive a first clock signal;

a second pumping capacitor in the peripheral circuit region comprising one end connected to a second node and an other end configured to receive a second clock signal that is complementary with the first clock signal;

a charging unit in the peripheral circuit region comprising a first n-type transistor configured to charge the first pumping capacitor with an input voltage based on the first clock signal, and a second n-type transistor configured to charge the second pumping capacitor with the input voltage based on the second clock signal; and an output unit in the peripheral circuit region connected to the charging unit via the first node and the second node, the output unit configured to alternately output node voltages of the first node and the second node to an output terminal in response to the first clock signal and the second clock signal, wherein a bulk of each of the first n-type transistor and the second n-type transistor is formed in a portion of a deep-n well formed on a p-type semiconductor substrate, and wherein a voltage greater than or equal to a voltage applied to the p-type semiconductor substrate is applied to the deep-n well responsive to operation of the charge pump.

15. The memory device of claim 14, wherein the first metal pad and the second metal pad formed of copper.

16. The memory device of claim 14, wherein the first metal pad and the second metal pad are connected by bonding manner.

17. The memory device of claim 14, wherein the memory cell region is formed on a first wafer and the peripheral circuit region is formed on a second wafer.

18. A memory device comprising:

a memory cell region including a first metal pad;

a peripheral circuit region including a second metal pad and vertically connected to the memory cell region by the first metal pad and the second metal pad;

a memory cell array in the memory cell region including a plurality of cell strings including a plurality of memory cells, a plurality of word lines respectively connected to the plurality of memory cells, a plurality of bit lines connected to one side of the plurality of cell strings, and a ground selection line connected to the plurality of cell strings;

a control logic in the peripheral circuit region configured to output a control signal that controls a program operation of programming data in the memory cell array and a read operation of reading data from the memory cell array; and a voltage generator in the peripheral circuit region configured to generate operation voltages used for the program operation and the read operation in response to the control signal, wherein the voltage generator comprises:

a charging unit comprising a first n-type transistor connected between an input terminal configured to receive an input voltage and a first node, a second n-type transistor connected between the input terminal and a second node, a first gate control element configured to control the first n-type transistor based on a first clock signal, and a second gate control element configured to control the second n-type transistor based on a second clock signal having a phase opposite to the first clock signal;

a first pumping capacitor comprising one end connected to the first node and an other end configured to receive the first clock signal;

a second pumping capacitor comprising one end connected to the second node and an other end configured to receive the second clock signal; and an output unit connected between the charging unit and an output terminal, the output unit configured to output a first voltage at the first node or a second voltage at the second node to the output terminal, wherein a bulk of each of the first n-type transistor and the second n-type transistor is formed in a portion of a deep-n well formed on a p-type semiconductor substrate, and wherein a voltage greater than or equal to a voltage applied to the p-type semiconductor substrate is applied to the deep-n well responsive to operation of the charge pump.

19. The memory device of claim 18, wherein the first metal pad and the second metal pad are connected by bonding manner.

20. The memory device of claim 18, wherein the memory cell region is formed on a first wafer and the peripheral circuit region is formed on a second wafer.

* * * * *